US010037446B2

(12) United States Patent
Scholz et al.

(10) Patent No.: US 10,037,446 B2
(45) Date of Patent: Jul. 31, 2018

(54) ELECTRICAL INTERFACE MODULE

(71) Applicant: PHOENIX CONTACT GMBH & CO. KG, Blomberg (DE)

(72) Inventors: Peter Scholz, Barntrup (DE); Fritz Felux, Extertal (DE); Lars-Peter Wimmer, Hameln (DE)

(73) Assignee: PHOENIX CONTACT GMBH & CO. KG (DE)

( * ) Notice: Subject to any disclaimer, the term of this patent is extended or adjusted under 35 U.S.C. 154(b) by 0 days.

(21) Appl. No.: 14/787,577

(22) PCT Filed: Apr. 28, 2014

(86) PCT No.: PCT/EP2014/058533
§ 371 (c)(1),
(2) Date: Oct. 28, 2015

(87) PCT Pub. No.: WO2014/177482
PCT Pub. Date: Nov. 6, 2014

(65) Prior Publication Data
US 2016/0078260 A1 Mar. 17, 2016

(30) Foreign Application Priority Data
Apr. 29, 2013 (DE) .................... 10 2013 207 755

(51) Int. Cl.
*G06K 7/10* (2006.01)
*H05K 5/02* (2006.01)
*H04B 5/00* (2006.01)

(52) U.S. Cl.
CPC ..... *G06K 7/10366* (2013.01); *G06K 7/10336* (2013.01); *H04B 5/0056* (2013.01); *H05K 5/0252* (2013.01)

(58) Field of Classification Search
CPC .......... G06K 7/10366; G06K 7/10336; H04B 5/0056; H05K 5/0252
(Continued)

(56) References Cited

U.S. PATENT DOCUMENTS

2003/0006878 A1* 1/2003 Chung ............... G06K 7/10346
340/5.25
2006/0244565 A1* 11/2006 Friedrich ........... G05B 19/4183
340/10.1
(Continued)

FOREIGN PATENT DOCUMENTS

DE 10 2012 016266 A1 2/2013
DE 10 2011 082002 A1 3/2013
(Continued)

OTHER PUBLICATIONS

International Search Report prepared by the European Patent Office dated Jun. 27, 2014, for International Application No. PCT/EP2014/058533.
(Continued)

*Primary Examiner* — Edwin Holloway, III
(74) *Attorney, Agent, or Firm* — Sheridan Ross P.C.

(57) ABSTRACT

The object of the invention is an electrical interface module. The electrical interface module has a memory device for storing data and an integrated NFC interface that provides data to an external reading device, wherein the electrical interface module contains a carrier on which the memory device and the integrated NFC interface are arranged.

15 Claims, 4 Drawing Sheets

(58) Field of Classification Search
USPC .......................................................... 340/10.1
See application file for complete search history.

(56) References Cited

U.S. PATENT DOCUMENTS

| | | | |
|---|---|---|---|
| 2008/0160925 A1* | 7/2008 | Rofougaran | H04L 12/66 455/73 |
| 2009/0058609 A1 | 3/2009 | Claymann | |
| 2009/0096574 A1* | 4/2009 | Oberle | G06F 21/35 340/5.8 |
| 2009/0195363 A1* | 8/2009 | Downie | G06K 5/02 340/10.4 |
| 2010/0033307 A1* | 2/2010 | Narendra | G06K 19/0701 340/10.1 |
| 2010/0264211 A1* | 10/2010 | Jain | G06F 1/1698 235/380 |
| 2012/0098664 A1* | 4/2012 | Nordin | G06K 7/0008 340/572.1 |
| 2012/0249304 A1 | 10/2012 | Liu et al. | |
| 2016/0080526 A1* | 3/2016 | Meyer-Graefe | G05B 19/0423 709/209 |

FOREIGN PATENT DOCUMENTS

| | | |
|---|---|---|
| EP | 2 421 344 A2 | 2/2012 |
| EP | 2 464 204 A1 | 6/2012 |

OTHER PUBLICATIONS

German Search Report prepared by the German Patent Office dated Apr. 8, 2014, for German Patent Application No. 102013207755.6.

* cited by examiner

US 10,037,446 B2

ELECTRICAL INTERFACE MODULE

CROSS REFERENCE TO RELATED APPLICATIONS

This application is a national stage application under 35 U.S.C. 371 and claims the benefit of PCT Application No. PCT/EP2014/058533 having an international filing date of Apr. 28, 2014, which designated the United States, which PCT application claimed the benefit of German Patent Application No. 10 2013 207 755.6 filed Apr. 29, 2013, the disclosures of each of which are incorporated herein by reference.

FIELD OF THE DISCLOSURE

The invention relates to an electrical interface module.

BACKGROUND

Electrical interface modules are known from the prior art. They are often installed in larger electrical systems.

In relation to the present invention, electrical interface modules are generally understood as being electronic components of automation technology that are used in control cabinets of industrial facilities, for example. Some examples of electrical interface modules are electronic switching devices, engine control units, (Ethernet) network elements, fieldbus components and systems, I/O devices, relay and protective devices, industrial communication technology devices, measurement technology and control engineering devices, and monitoring and signaling devices.

This results in the problem that these components must be recorded in circuit diagrams, as well as the problem that they have to be identified and provided with comprehensive assembly instructions with respect to their connection and installation. A test record or the like must also be enclosed with each individual component.

The recording of individual components and the provision of identifiers is laborious. What is more, there is hardly enough space in larger circuit systems with relatively small installation space to add an individual identification.

Due to the lack of installation space, there are generally no assembly instructions within reach during installation and maintenance, so those must also be explicitly brought in for each component.

The increasing restriction of installation space also has the effect that visual displays are usually omitted, since they take up precious installation space.

At the same time, it would be desirable to obtain additional information about the components in order to enable plans to be made in advance for this kind of replacement or to recognize an impending breakdown before it occurs and replace the affected components on the basis of actual signs of aging.

SUMMARY

It is the object of the invention to provide an improved electrical interface module that circumvents one or more drawbacks of the prior art in an inventive manner.

The object is achieved according to the invention by the features of the independent claim. Advantageous embodiments of the invention are particularly indicated in the dependent claims.

In the following, the invention is explained in further detail with reference to the enclosed drawing on the basis of preferred embodiments.

DETAILED DESCRIPTION

Figure 1:
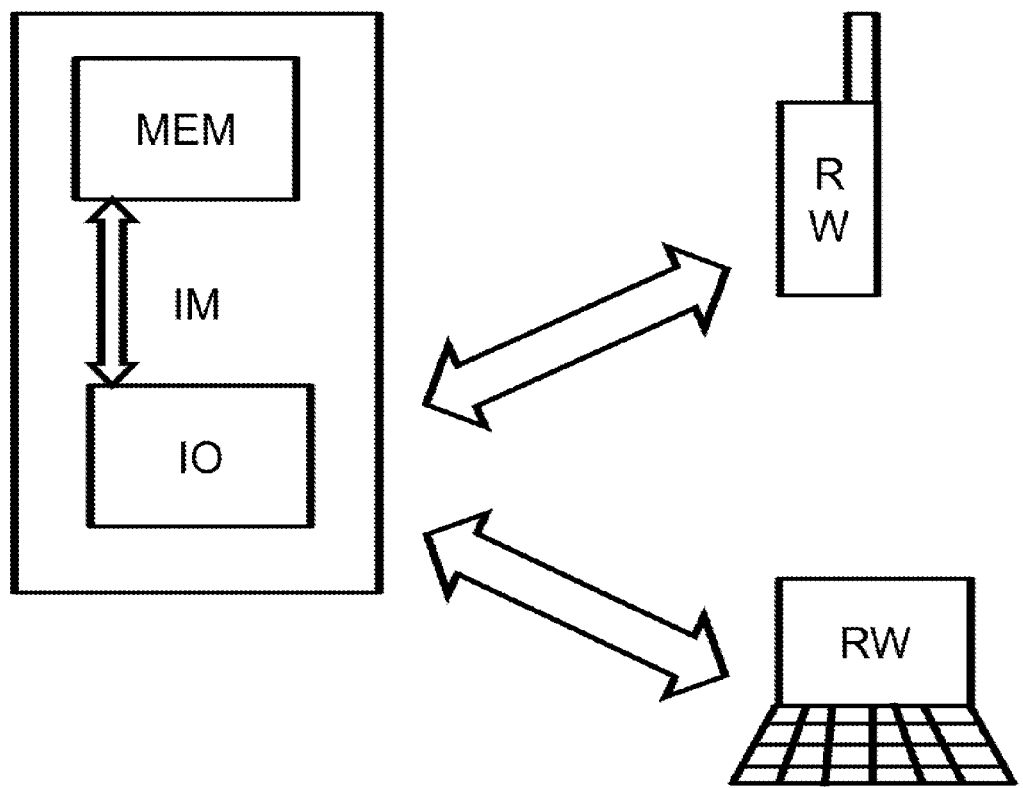
FIG. 1 shows a schematic representation of an electrical interface module according to a preferred embodiment of the invention.

FIG. 1 shows an electrical interface module IM according to a preferred embodiment of the invention.

The electrical interface module IM has a memory device MEM for storing data. Any suitable form of the memory can be used for this. For example, a flash memory or a NAND memory can be used as the memory, since they are able to hold the data without voltage. This is especially helpful if the corresponding component is currentless and no power supply is present.

Moreover, the electrical interface module IM also has an integrated NFC IO interface that provides data to an external reading device, or reading and writing device RW. In addition, the requirements for galvanic isolation are thus rendered easier to achieve.

The NFC IO interface can be set up so as to be active or passive. In a passive embodiment of the NFC IO interface, it does not require its own power supply; rather, the NFC IO interface is powered from the wireless energy of a reading writing device. This is especially advantageous if the corresponding component is currentless and no power supply is present. In addition, the requirements placed on galvanic isolation are rendered easier to achieve.

The data that are made available to the external reading device RW are selected from a group comprising: product data, particularly a serial number and/or batch number and/or a manufacturing date and/or a manufacturer identification and/or a place of manufacture, an instruction manual, assembly instructions, a reference to an Internet page, test data, particularly data on the final manufacturing inspection, status data, particularly error status, degradation, configuration data, particularly parameterization data.

A wealth of product-specific data is thus made available to a user of the electrical interface module IM according to the invention, enabling him to plan a targeted operation. In particular, the startup of a system is simplified substantially, since it is no longer necessary to keep assembly plans on hand.

Moreover, important access data of the electrical interface module IM are made available to the user, such as error status, degradation, configuration data, and particularly parameterization data, that are difficult to represent with conventional displays, particularly under the constraint of a small installation space.

In another embodiment of the invention, the data that are made available to the external reading device RW are selected from a group comprising: startup data, designation of an installation site, periodic inspection data, status indicator, readout via an external reading device RW, type of external reading device RW used, climate data for the installation site, particularly temperature and/or atmospheric humidity, mains voltage failure, functional range, parameter data, site identification.

Figure 2:
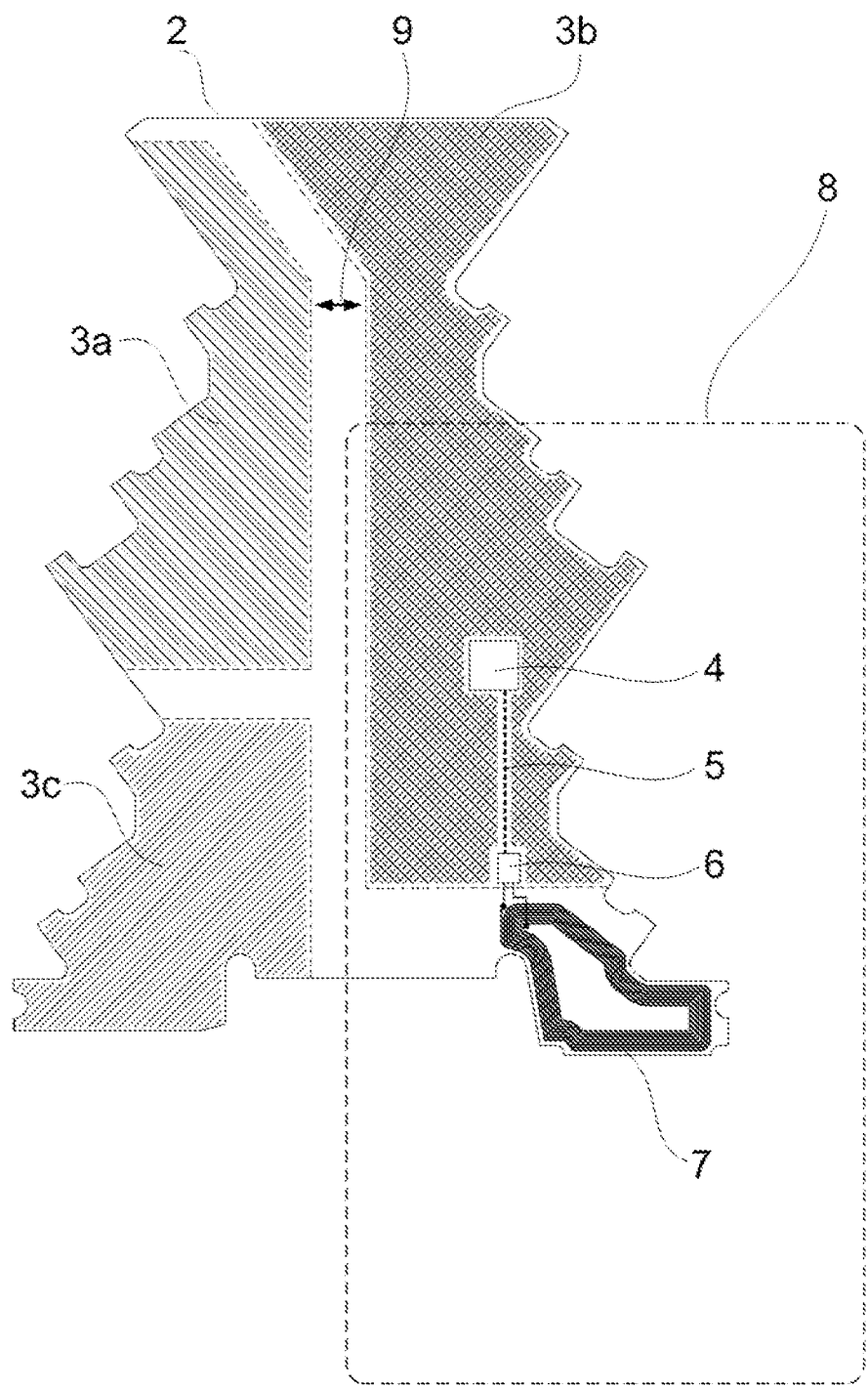
FIG. 2 shows an exploded schematic representation of an exemplary embodiment of an electrical interface module according to the invention.
Figure 3:
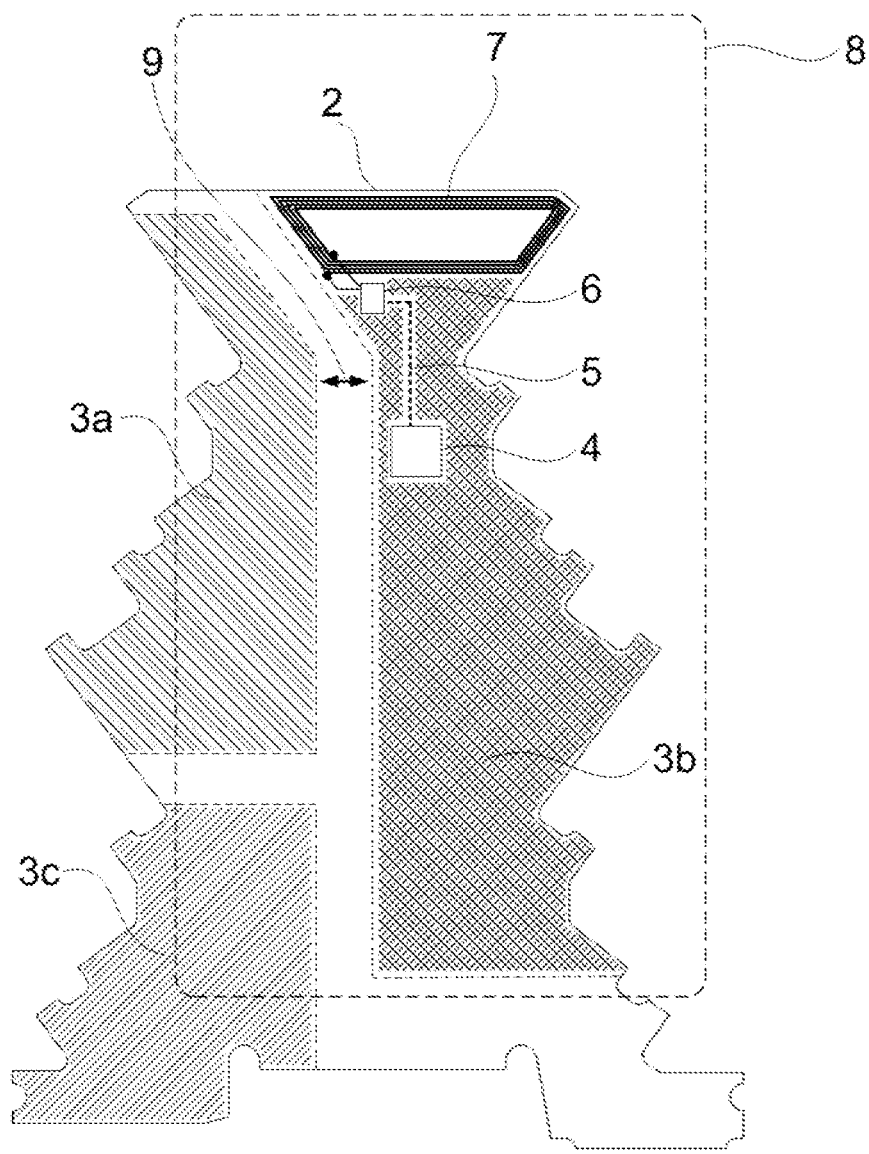
FIG. 3 shows an exploded schematic representation of another exemplary embodiment of an electrical interface module according to the invention.

These data simplify the inspection of an existing system. Moreover, it is possible to distinguish whether data are read in or out by means of a special reading device RW, such as, for example, by means of a laptop shown in stylized form at the bottom in FIG. 1, or with a smartphone application, such as, for example, by means of a mobile telephone 8 shown in stylized form at the top of FIG. 1 and in FIGS. 2 and 3. However, the invention is not limited to these embodiments; rather, other embodiments can involve a tablet PC, for example, as a reading device 8 [sic]. There are different possible orientations of the reading device RW, as shown in FIGS. 2 and 3 in relation to the respective (planar) antenna 7, and this can be dependent on the embodiment of the respective reading device RW or mobile telephone 8 and the respective electrical interface module IM.

In another embodiment of the invention, the integrated IO NFC interface can be embodied such that data from an external writing device RW are made available and stored in the memory device MEM.

In this additional embodiment of the invention, it is preferred if the data made available by the external reading device RW are selected from a group comprising: product data, particularly a serial number and/or batch number and/or a manufacturing date and/or a manufacturer identification and/or a place of manufacture, an instruction manual, assembly instructions, a reference to an Internet page, test data, particularly data on the final manufacturing inspection, and information on reordering from the manufacturer. Through the provision of data registration, it becomes possible to store all of the relevant production data, particularly test data and serial numbers, after production of the electrical interface module IM without the need for physical contact access to the memory MEM.

In this additional embodiment of the invention, it is likewise preferred if the data that are made available by the external reading device RW are selected from a group comprising: startup data, designation of an installation site, periodic inspection data, readout via an external reading device RW, and type of external reading device RW used. These data simplify the inspection of an existing system.

In this additional embodiment of the invention, it is likewise preferred if the data that are made available by the external reading device RW contain configuration data for the operating mode of the electrical interface module IM. For instance, the configuration data can contain various characteristic temperature curves, voltage or current ranges or other customer-specific settings. As a result, the electrical interface module IM can be personalized or configured and/or parameterized with the aid of the NFC IO interface.

This is particularly advantageous for the passive operating mode of the NFC IO interface, since individual configuration data can be written in a contactless manner to the memory MEM beforehand, for example when the electrical interface module IM is in the packaged state, and be available at startup for the interface module IM.

A provision can readily be made that at least a portion of the product-specific data is stored with write protection or password protection. At least a portion of the system-specific data can also be stored with write protection or password protection. Different protective mechanisms and/or passwords can thus be provided.

In addition, a provision can be made that the operating data field can only be read by use of an NFC interface.

Although the writing device and the reading device are described as separate devices, their functionality can also be available in combined form in one device.

By use of electrical interface modules IM according to the invention, the components can easily be recorded in circuit diagrams through data migration, for one thing; for another, however, the electrical interface modules IM can also be identified in accordance with the circuit diagrams. In addition, assembly instructions pertaining to connection and installation can also be made available by means of the electrical interface module IM according to the invention, so that they are always present at the installation site. As a result, separate storage or procurement of the assembly instructions is rendered unnecessary. What is more, a test record or the like can be enclosed with the electrical interface modules IM according to the invention.

Particularly in large control rooms in which little space is available, identification is substantially simplified and expediently enabled by the invention.

In addition, further displays can also be implemented by means of the electrical interface modules IM according to the invention that would otherwise not be possible based on available space requirements. In particular, the invention makes it possible to obtain additional data of the electrical interface module IM in order to plan a replacement in advance or to identify an impending failure and replace the components on the basis of actual signs of aging.

What is more, the use of NFC interfaces offers the advantage that a larger quantity of data can be made available. In particular, the data can be stored as xml data.

The construction being presented particularly makes it possible to manufacture flat electrical interface modules IM, thus minimizing space requirements while making new functionality available. In particular, the construction being presented enables the provision of electrical interface modules IM having a width of less than 36 mm, particularly less than 23 mm, particularly less than 18 mm, particularly less than 13 mm, and especially preferably less than 7 mm.

For example, in the embodiment with a width of 7 mm, the construction enables a carrier 2, for example a printed circuit board, equipped on at least one side with an SMD and having the NFC IO interface and the actual interface elements. This carrier 2 can then be readily arranged in a narrow housing. Moreover, different regions 3a, 3b, 3c are identified on the carrier that are available, for example, for different tasks of the electrical interface module or of the components required for this. Alternatively or in addition, the different regions 3a, 3b and 3c can also designate different potential groups that are galvanically isolated from one another, for example, and can be connected with the aid of coupling elements. This kind of exemplary arrangement is shown in FIGS. 2 and 3.

Alternatively or in addition, a wired bus system can also be provided. In particular, an exemplary bus system can also be provided that is located in the mounting rail 11 and is contacted by the individual electrical interface modules IM upon placement onto the mounting rail 11.

In another embodiment, a provision is made that the carrier 2 has a planar antenna 7 for the integrated NFC IO interface. This enables an improved exchange between the individual electrical interface modules IM for one thing and flat electrical IM interface modules for another.

The integrated NFC interface can be constructed as shown schematically in FIGS. 2 and 3, for example. Besides the actual transmitting and receiving unit that is present in a chip 6, for example, the NFC IO interface can also have a (planar) antenna 7. It is readily possible in some embodiments for the chip 6 to also have the antenna 7 already built in, or an antenna can be added as a component, for example as a coil. Obviously, this kind of coil, which acts as an antenna 7, can also be embodied as an SMD-enabled component or as an antenna in the plastic housing or adhered to the housing wall by means of a film. In addition, a (planar) antenna can also be embodied as an independent component; otherwise, however, the planar antenna 7 can also be manufactured from conductor paths on the carrier 2. What is more, a connection with other parts is also established by means of a suitable connection on the electrical interface module IM. For the sake of example, a connection via another interface 5 to a controller 4 is shown in FIGS. 2 and 3. In addition to a 1-wire bus, exemplary interfaces can also have other serial or parallel interfaces or other interfaces, such as an I²C bus, for example. The controller can be a microcontroller or any other logic circuit.

Figure 4:
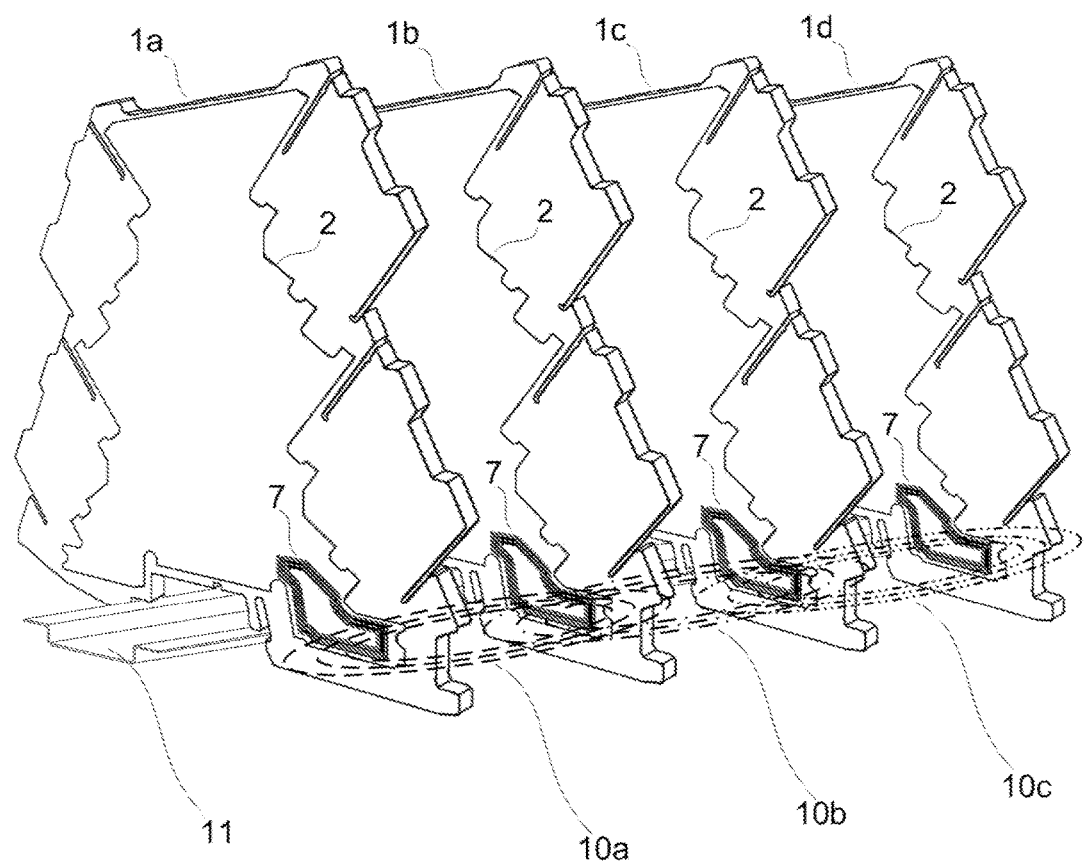
FIG. 4 shows an exploded schematic representation of a plurality of electrical interface modules according to exemplary embodiments of the invention in relation to one aspect of the invention.

FIGS. 2, 3 and 4 show various views of different embodiments. The electrical interface module IM is suitable for mounting on a mounting rail 11. One example of a mounting rail 11 is a cap rail.

In the embodiment that is shown in FIG. 2, the (planar) antenna 7 is arranged in the vicinity of the mounting area for the mounting rail 11. This leaves more installation space for the actual interface components and the connections and displays in the region on the opposite side.

In the embodiment that is shown in FIG. 3, the (planar) antenna 7 is arranged in a region opposite from the mounting areas for the mounting rail 11. This facilitates communication with an external reading device RW, thus enabling it to communicate (i.e., exchange data) with the electrical interface module IM from a greater distance.

To a person skilled in the art, it is readily clear that other positions can also be provided between these two positions for the (planar) antenna 7 and the chip 6, thus obtaining an at least partial benefit from the respective advantages.

It is especially advantageous if adjacent electrical interface modules IM are arranged such that they are able to exchange data and/or power with other electrical interface modules IM located in the vicinity via the respectively integrated NFC IO interface. One exemplary arrangement thereof is shown in FIG. 4, which illustrates the desirable—but not necessary—case of the equal arrangement of the NFC interfaces at least in relation to the respective (planar) antennas 7. For the sake of example, FIG. 4 shows strung-together electrical interface modules IM, each of which has its own housing 1a, 1b, 1c, . . . . At least one carrier 2 is arranged within the housing, with a (planar) antenna 7 in turn located thereon. To simplify the illustration, exemplary magnetic field lines are respectively shown such as those which could form during the data and/or power exchange between the individual electrical interface modules IM. For example, the field lines 10a—represented by broken lines—could be formed by the first interface module IM, which is located in a housing 1a. For example, these field lines 10a can engage in the region of the (planar) antenna 7 of the second interface module directly adjacent to the first, so that power and/or data can be exchanged between the adjacent interface modules by means of the field. This is also possible in like manner for the second interface module, with the magnetic field lines 10b being shown here with dot-dashed lines for purposes of differentiation. The field lines can of course also be readily embodied such that they are also able to transmit power and data beyond an adjacent interface module. In this way, for example, gaps and/or defective modules can be bridged over, and/or, as will be described later, even identified as defective and/or reconfigured.

In one exemplary embodiment, the adjacent interface modules IM are embodied such that adjacent electrical interface modules IM form a logical data bus via the integrated NFC interfaces IO that can be addressed and/or controlled by means of at least one head module or one master module with a higher control and/or monitoring device. For example, one of the interface modules can be assigned the function of a master module, or a special head module that acts as a master can be introduced on one side of adjacent electrical interface modules IM or between adjacent electrical interface modules IM.

In one embodiment, a provision is made, for example, that adjacent electrical interface modules IM form an ad hoc network.

Insofar as reference is made above to an NFC interface, the invention is not limited to NFC; rather, it is merely an example of a near-field transmission technique. Another exemplary near-field transmission technique is RFID, for example, which can be used as an alternative to NFC.

LIST OF REFERENCE SYMBOLS

| | |
|---|---|
| Electrical interface module | IM |
| Memory | MEM |
| NFC interface/RFID interface | IO |
| Writing device, reading device | RW |
| Housing | 1; 1a, 1b, 1c |
| Carrier | 2 |
| Component regions | 3a, 3b, 3c |
| Controller | 4 |
| Interface | 5 |
| Interface chip | 6 |
| Antenna (planar) | 7 |
| Mobile telephone, smartphone, tablet PC | 8 |
| (Magnetic) field lines | 10a, 10b, 10c |
| Mounting rail | 11 |

The invention claimed is:

1. An assembly of electrical interface modules comprising:
    a plurality of electrical interface modules mounted on a mounting rail of a control cabinet, each electrical interface module comprising:
        a memory device for storing data;
        an integrated NFC interface that provides data to an external reading device, the integrated NFC interface comprising an antenna; and
        a carrier on which the memory device and the integrated NFC interface are arranged,
    wherein the NFC interface antenna of each of the plurality of interface modules is oriented substantially similarly, and further wherein the integrated NFC interface of each electrical interface module is configured to exchange at least one of data and power with adjacent ones of the plurality of electrical interface modules.

2. The assembly of electrical interface modules as set forth in claim 1, wherein the data provided to the external reading device are selected from a group comprising:
    product data, the product data comprising at least one of a serial number, a batch number, a manufacturing date, a manufacturer identification, and a place of manufacture, an operating manual,
assembly instructions,
a reference to an Internet page,
test data, the test data comprising data from a final manufacturing inspection,
information for reordering from the manufacturer,
status data, the status data comprising error status, degradation,
configuration data, the configuration data comprising parameterization data.

3. The assembly of electrical interface modules as set forth in claim 2, wherein at least a portion of the data provided to the external reading device is write-protected or password-protected.

4. The assembly of electrical interface modules as set forth in claim 1, wherein the data provided to the external reading device are selected from a group comprising:
startup data,
identification of an installation site,
periodic inspection data,
status indicator,
readout via an external reading device,
type of external reading device used,
climate data at the installation site, the climate data comprising at least one of temperature and atmospheric humidity,
mains voltage failure,
functional range,
parameter data, and
site identification.

5. The assembly of electrical interface modules as set forth in claim 1, wherein the integrated NFC interface receives data from an external writing device and stores the received data in the memory device.

6. The assembly of electrical interface modules as set forth in claim 5, wherein at least a portion of the received data is write-protected or password-protected.

7. The assembly of electrical interface modules as set forth in claim 5, wherein the data received from the external writing device are selected from a group comprising:
product data, the product data comprising at least one of a serial number, a batch number, a manufacturing date, a manufacturer identification, and a place of manufacture,
an operating manual,
assembly instructions,
a reference to an Internet page,
configuration data, the configuration data comprising parameterization data,
test data, the test data comprising data from a final manufacturing inspection.

8. The assembly of electrical interface modules as set forth in claim 5, wherein the data received from the external writing device are selected from a group comprising:
startup data,
identification of an installation site,
periodic inspection data,
readout via an external reading device, and
type of external reading device used.

9. The assembly of electrical interface modules as set forth in claim 8, with at least a portion of the received data being write-protected or password-protected.

10. The assembly of electrical interface modules as set forth in claim 1, wherein the NFC interface is an active NFC interface.

11. The assembly of electrical interface modules as set forth in claim 1, wherein each of the plurality of electrical interface modules has a width of less than 7 mm.

12. The assembly of electrical interface modules as set forth in claim 1, wherein each of the plurality of electrical interface modules has a width of less than 36 mm, or less than 23 mm, or less than 18 mm, or less than 13 mm.

13. The assembly of electrical interface modules as set forth in claim 1, wherein the antenna is a planar antenna.

14. The assembly of electrical interface modules as set forth in claim 1, wherein the antenna is a planar antenna, and further wherein the planar antenna is arranged in the vicinity of the mounting region for the mounting rail.

15. The assembly of electrical interface modules as set forth in claim 1, wherein the antenna is a planar antenna arranged in a region opposite from an assembly region for the mounting rail.

* * * * *